US005834877A

United States Patent [19]

Buisker et al.

[11] Patent Number: 5,834,877

[45] Date of Patent: Nov. 10, 1998

[54] ULTRASONIC TRANSDUCER UNITS FOR WEB DETECTION AND THE LIKE

[75] Inventors: Raymond A. Buisker; Andrew Kalnajs, both of Madison, Wis.

[73] Assignee: Accuweb, Inc., Madison, Wis.

[21] Appl. No.: 697,541

[22] Filed: Aug. 27, 1996

Related U.S. Application Data

[60] Provisional application No. 60/002,857 Aug. 28, 1995.

[51] Int. Cl. 6 .......... H01L 41/08

[52] U.S. Cl. .......... 310/322; 310/324; 310/336

[58] Field of Search .......... 310/322, 334, 310/336

[56] References Cited

U.S. PATENT DOCUMENTS

| | | | |
|---|---|---|---|
| 2,989,725 | 6/1961 | Miller | 340/9 |
| 3,379,901 | 4/1968 | Richards | 310/328 |
| 3,396,286 | 8/1968 | Anderson et al. | 310/328 |
| 3,573,669 | 4/1971 | Papadakis | 333/30 |
| 3,752,941 | 8/1973 | Massa et al. | 179/110 A |
| 3,859,984 | 1/1975 | Langley | 128/2.05 Z |
| 3,885,173 | 5/1975 | Lee | 310/9.4 |
| 3,928,777 | 12/1975 | Massa | 310/8.2 |
| 4,011,473 | 3/1977 | Massa | 310/8.2 |
| 4,118,649 | 10/1978 | Shwartzman et al. | 310/337 |
| 4,128,370 | 12/1978 | Massa | 425/128 |
| 4,160,517 | 7/1979 | Buisker et al. | 226/19 |
| 4,217,684 | 8/1980 | Brisken et al. | 29/25.39 |
| 4,283,649 | 8/1981 | Heinouchi | 310/324 |
| 4,523,122 | 6/1985 | Tone et al. | 310/334 |
| 4,568,848 | 2/1986 | Ogawa | 310/313 B |

(List continued on next page.)

FOREIGN PATENT DOCUMENTS

| | | | |
|---|---|---|---|
| 55-120299 | 9/1980 | Japan | 310/334 |
| 55-128999 | 10/1980 | Japan | 310/334 |
| 57-142098 | 9/1982 | Japan | 310/322 |
| 89375 | 6/1957 | Norway | 310/334 |

OTHER PUBLICATIONS

NGK Spark Plug Co., Ltd., NTK Ultrasonic Sensor, (no date).

Murata Manu. Co., Ltd., Specification of Transducer, Type MA200A1, 1986.

Murata Erie Catalog No. S–02–A, "Sensors", pp. 36–38, 1992.

Polaroid, Technical Specifications for "K" Series Closed Faced Piezo Transducers, 1993.

*Primary Examiner*—Thomas M. Dougherty
*Attorney, Agent, or Firm*—Foley & Lardner

[57] ABSTRACT

An ultrasonic transducer unit for web edge detection includes multiple transducer elements attached to a single sound conducting plate. The transducer elements are preferably piezoelectric disks, and the sound conducting plate is preferably formed of hollow glass microspheres in an epoxy matrix. Multiple transducer elements may be positioned on the sound conducting plate in various geometric arrangements. Transducer units in accordance with the present invention may be mounted in a web edge detector head, such that pairs of transmitting and receiving transducer elements face each other across a detection gap through which a web of material is passed. Individual transducer elements within each transducer unit are activated to transmit/receive an ultrasonic beam in a selected pattern to provide both web edge sensing and ultrasonic signal compensation for varying ambient conditions in the detection gap. Each transducer unit may include a spacer attached to the sound conducting plate and surrounding the transducer elements, and a sealing plate attached to the spacer to enclose the transducer elements within the transducer unit. Transducer element control circuits may be mounted on a portion of the sealing plate which forms a circuit board that is electrically connected to the transducer elements and to a main controller external to the detector head.

16 Claims, 4 Drawing Sheets

U.S. PATENT DOCUMENTS

| | | | |
|---|---|---|---|
| 4,583,056 | 4/1986 | Takeda et al. | 331/67 |
| 4,600,851 | 7/1986 | Isayama et al. | 310/324 |
| 4,684,843 | 8/1987 | Ohya et al. | 310/355 |
| 4,705,981 | 11/1987 | Inoue et al. | 310/324 |
| 4,752,709 | 6/1988 | Fujishima et al. | 310/313 A |
| 4,755,975 | 7/1988 | Ito et al. | 367/140 |
| 4,859,897 | 8/1989 | Massa | 310/334 |
| 4,894,895 | 1/1990 | Rokurohta et al. | 29/25.35 |
| 5,025,666 | 6/1991 | Kobayashi et al. | 73/632 |
| 5,061,870 | 10/1991 | Ieki et al. | 310/313 A |
| 5,072,414 | 12/1991 | Buisker et al. | 364/550 |
| 5,126,616 | 6/1992 | Gorton et al. | 310/334 |
| 5,259,099 | 11/1993 | Banno et al. | 29/25.35 |
| 5,274,573 | 12/1993 | Buisker et al. | 364/550 |
| 5,376,859 | 12/1994 | Kim et al. | 310/334 |
| 5,436,874 | 7/1995 | Kuhn et al. | 367/176 |
| 5,642,109 | 6/1997 | Crowley et al. | 341/22 |

ULTRASONIC TRANSDUCER UNITS FOR WEB DETECTION AND THE LIKE

This application claims the benefit of U.S. Provisional Application Ser. No. 60/002,857, filed Aug. 28, 1995.

FIELD OF THE INVENTION

This invention pertains generally to ultrasonic transducers and particularly to ultrasonic web edge detection apparatus for monitoring the position of the edge of a moving web to allow the position of the moving web to be controlled.

BACKGROUND OF THE INVENTION

In the handling of various types of web and sheet materials, it is important to be able to accurately position the moving material to ensure that the material remains on track and precisely aligned for various subsequent operations, such as cutting, slitting, printing and the like. Edge detectors which detect the lateral position of the edge of the moving web are utilized in such industries as paper making and converting, where the moving material is paper or non-woven fibrous webs, in the printing industry, for photographic film manufacturing, for video tape and other magnetic media manufacturing, and in the plastic packaging and forming industry.

A variety of techniques have been utilized to sense the position of the moving web, including photoelectric sensors in which the amount of interruption of a beam of light by the web is detected, air sensors in which a moving stream of air is directed across the edge of the web and the occlusion of the air is detected, and ultrasonic sensors which direct a beam of ultra-high frequency sound across the edge of the web and detect the amount of occlusion of the beam by the web. Ultrasonic transducers provide an electrical signal which is related to the lateral position of the web, with this signal being utilized to control positioning mechanisms to bring the moving web back to its desired edge position. Ultrasonic edge position detectors have a number of advantages over photoelectric and air sensors, particularly with transparent or translucent web materials such as thin paper sheets or transparent plastic, where photoelectric sensors may be difficult or impossible to use. Air sensors can sense translucent or transparent materials, however, they can cause fluttering of the web edge, particularly with thin materials, which can impair sensing accuracy.

In an ultrasonic web edge detector, a sound emitting transducer (transmitter) projects a beam of high frequency sound across a gap where it is either received directly by a microphone (receiver) on the other side of the gap or is reflected back to a microphone. As the edge of a web enters the gap, it partially blocks the sound beam, with the sound energy received by the microphone being roughly inversely related to the percentage of occlusion of the sound beam by the web. The relationship between the degree of occlusion and the signal provided by the microphone can be determined for a particular web material and the processing electronics which receives the signal can be adjusted accordingly so that the final control signal is truly proportional to the lateral position of the web edge.

While ultrasonic web detectors enjoy several advantages over other types of edge sensors, various ambient operating conditions can affect the accuracy of the control signals produced by the sensing system. For example, changes in the relative humidity of the ambient air can affect the propagation of the ultrasonic signal and thereby affect calibration, so that a sensor which is properly calibrated on one day may be somewhat off in its readings the next day when the ambient atmosphere has a different relative humidity. Other conditions which can affect the accuracy of the reading from the edge sensor include the temperature of the air, which also affects the sound conduction of the air in the gap, the temperature of the ultrasonic transducers, which affects their sensitivity, and air currents in the gap which can cause transient variations in the signal produced by the sensor and which effectively add a "noise" component to the signal of interest.

U.S. Pat. Nos. 5,072,414 and 5,274,573 to Buisker, et al. describe ultrasonic web edge detection methods and apparatus including a detector head employing two sets of transmitters and receivers, one set to detect the position of the edge of the web, and a second set mounted near to the first set which is used to measure the sound transmission characteristics of the ambient air to allow compensation of the signal received from the transmitter and receiver set which detects the edge of the web. The sound signals from the adjacent transmitters can be alternately pulsed to allow each of the two adjacent receivers to detect substantially only the ultrasound from the appropriate one of the transmitters.

A typical commercially available ultrasonic transmitter or receiver suitable for use in detector systems such as is shown in U.S. Pat. Nos. 5,072,414 and 5,274,573 employs a piezoelectric disk adhered to the bottom of a plate of sound transmitting material, with the piezoelectric disk being enclosed within a casing. Electrical connections are made to the metallized top and bottom surfaces of the piezoelectric disk to allow electrical power to be supplied to a transmitting piezoelectric disk which is used to transmit ultrasound signals, or to receive electrical signals corresponding to the ultrasound detected by a receiving piezoelectric disk. These commercially available piezoelectric transducer units can be individually mounted in the arms of a detector head to form either the transmitters or the receivers for the web edge detector.

Where two sets of piezoelectric transmitters and receivers are utilized in a detector head, as in the aforesaid patents, the conventional piezoelectric transducer has several limitations. In particular, conventional commercial piezoelectric transducers are relatively large and must be spaced away from each other to minimize the transmission of sound from one transducer to the other, and, of course, the cost of dual sets of transducers is twice that of a single set of such transducers. Further, for applications such as described in the aforesaid patents, it is important that each set of transducers be as closely matched to the other as possible so that the transmitter and receiver used for compensation will provide output signals which are substantially the same as the output signals which are received from the web edge detecting transmitter and receiver when there is no web in the gap between the transmitter and receiver. In practice, because of variabilities in the characteristics of the sound transmission plate in each of the transducers, variabilities in the mechanical and electrical characteristics of the piezoelectric disks, and other manufacturing variances between the individual commercially available transducer units, the characteristics of the individual transducers are difficult and costly to match. Further, in the mounting of the individual transducers in the detector head, alignment of the transmitter and receivers can be critical, since a misaligned transmitter may result in the ultrasound beam not being directly received by the opposed receiving unit, or being sufficiently misaligned so that different output characteristics are provided from the two sets of transmitters and receivers when transmitting across the same ambient air gap.

SUMMARY OF THE INVENTION

In accordance with the present invention, improved ultrasonic web edge detection is obtained utilizing a unitary ultrasonic transducer which has multiple ultrasonic transducer elements such as piezoelectric disks. Each transducer unit may be utilized either as a transmitter or a receiver, or both. The transducer units are compact, allowing smaller web edge detector structures than previously possible, and less expensive than multiple individual transducer units. The individual transducer elements in each unit are accurately aligned, and remain so during use. The unitary transducer structure allows the variation between signals obtained from different sets of transmitters and receivers to be minimized. Two or more ultrasonic transducer elements may be utilized in each transducer unit without interference as a consequence of sound transmitted from one of the transducer elements to the other. The utilization of more than two transducer elements in each of the transducer units enables a wider range of web sizes and movements to be detected than heretofore possible, as well as permitting more refined compensation techniques by utilizing more than one pair of compensation transmitters and receivers.

A transducer unit of the invention includes a single integral plate of sound conducting material having a top or outer surface and a bottom or inner surface, with a plurality of transducer elements being mounted to the bottom or inner surface of the sound conducting plate. The sound conducting plate is formed of a material, such as hollow glass microspheres in an epoxy matrix, which provides faithful sound conduction from the inner surface to the outer surface or vice versa, with minimal attenuation between these surfaces. The preferred ultrasonic transducer elements are piezoelectric disks which may be formed of conventional piezoelectric ceramic material having a circular periphery and flat top and bottom surfaces to which conducting metal is applied to form conducting plates across which an electrical potential may be applied to the piezoelectric element, or from which an electrical signal may be detected as a result of strains in the piezoelectric material. The top surface of each disk is preferably adhered to the bottom surface of the sound conducting plate, such as with an epoxy adhesive, to provide physical support and sound coupling between the transducer element and the sound conducting plate. A spacer may be provided between and surrounding the transducer elements to allow the back of the transducer elements to be sealed from the ambient atmosphere by a sealing plate, which can also function as a circuit board to which electrical connections can be made between the transducer elements and external circuitry. If desired, further electronic components can be formed on the board, such as preamplifiers and other signal conditioning circuit elements. The entire transducer unit can then be mounted in place within a detector head, such as a conventional U-shaped detector head having a gap between two arms which hold the respective transmitter and receiver units. The transducer units can be sealed into the detector head to avoid contamination from dirt, moisture or other fluids, and the unitary flat surface of each transducer can be readily cleaned if any contaminants accumulate on it.

Each of the transducer units of the present invention can function either as a transmitter or as a receiver, and in a preferred detector head are mounted opposite one another across a gap in two arms of the detector head. In one of the transducer units, the outermost transducer element functions as the ultrasonic transmitter for detecting the web edge and the outermost transducer element in the opposite transducer unit functions as the receiver for the sound wave passing the web edge. The next inner transducer element in the first transducer unit would then typically be utilized as the transmitter for the compensation sound beam which would be received by the next inner transducer element in the opposite transducer unit. By utilizing more than two transducer elements in each transducer unit, more than one of the transducer elements in each transducer unit may project a sound beam which is fully or partially blocked by the web, so that a more inwardly spaced transducer element or elements would be utilized to project the sound beam for compensation purposes which would not be blocked by the web.

Because each of the transducer elements is firmly and accurately mounted in a fixed position on the sound conducting plate, and the plate is controlled in both its thickness and the parallelism of its top and bottom surfaces, the position and alignment of the transducer elements is precisely maintained in each transducer unit, and the sound transmission or reception characteristic of each transducer element is closely matched to that of the others. The characteristics of individual elements in a batch can be electrically tested and the most closely matched elements sorted into pairs (or larger groups if array sensors are to be constructed). In accordance with the present invention, it is found that because of the minimal persistence of sound in the sound conduction material after the sound signal has been transmitted by a transducer element acting as a transmitter, or received by a transducer element acting as a receiver, there is substantially no interference between the adjacent transducer elements even though they are mounted to the same integral sound conducting plate. Consequently, the transducer elements can be mounted relatively close to one another and be arranged in any preferred geometry so as to obtain a desired pattern of transmission or reception. Such mounting includes offsetting of the positions of the adjacent multiple transducer elements so that the lateral positions of adjacent transducer elements overlap in a direction moving inwardly from the outer edge of the transducer unit.

Further objects, features and advantages of the invention will be apparent from the following detailed description when taken in conjunction with the accompanying drawings.

DETAILED DESCRIPTION OF THE INVENTION

Figure 1:
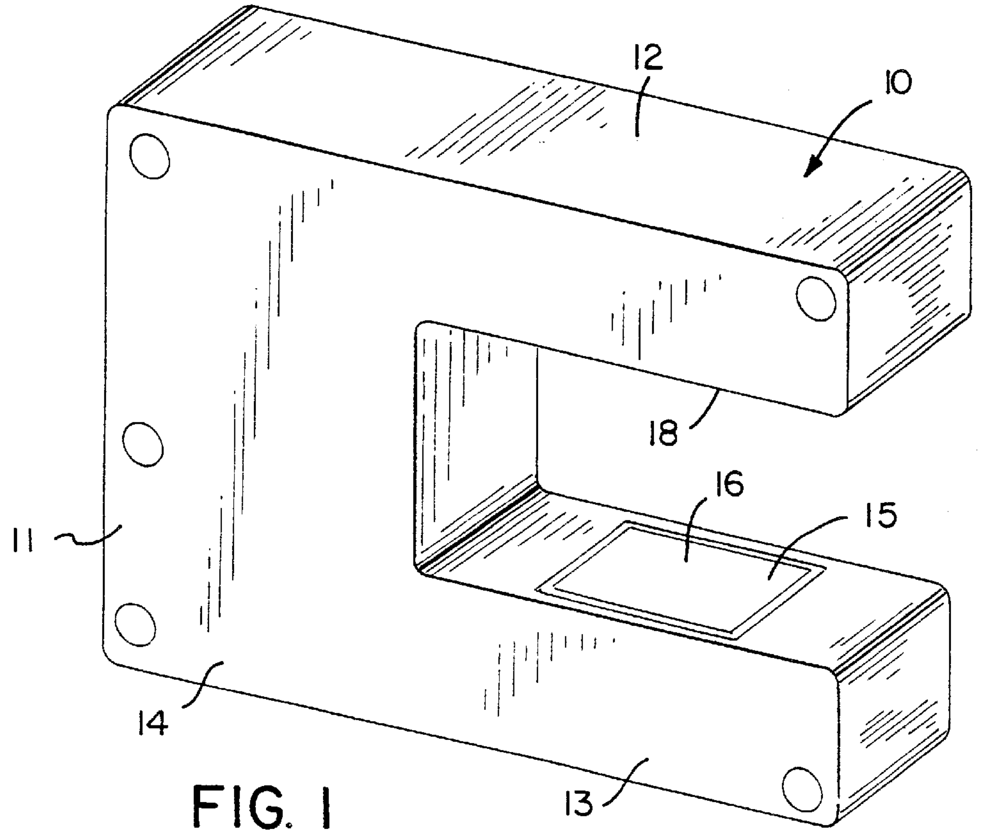
FIG. 1 is an illustrative perspective view of a detector head for ultrasonic web detection in accordance with the invention.
Figure 2:
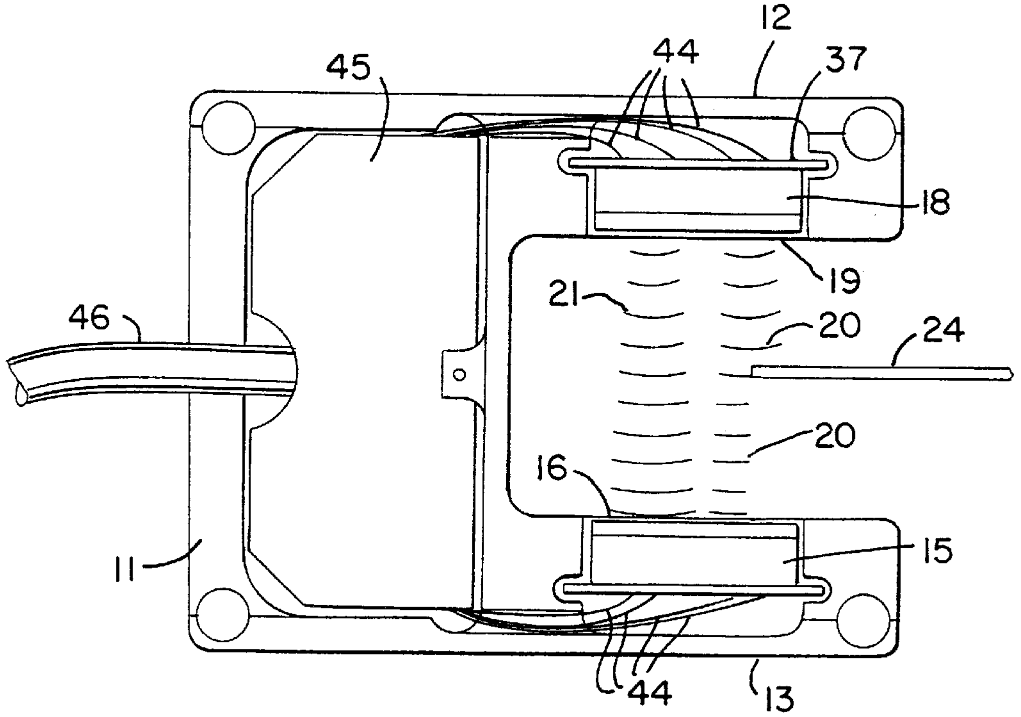
FIG. 2 is a view of the detector head of FIG. 1 with a cover plate removed to show the arrangement of the internal components.

With reference to the drawings, a detector head in accordance with the invention is shown generally at 10 in FIG. 1. The detector head 10 has a metal frame having a central base section 11, an upper arm 12 and a lower arm 13. The upper and lower arms 12 and 13 extend outwardly from the base 11 and define a gap between them into which a web of material such as paper, plastic film, etc., can pass. A first or lower transducer unit 15 is mounted in the lower arm 13 and has an upwardly facing substantially rectangular face 16, as shown in FIG. 1. A similar second or upper transducer unit 18 (shown in FIG. 2), having a flat rectangular face 19 similar to the face 16 of the unit 15, faces downwardly across the gap between the two transducer units 15 and 18. The transducer units 15 and 18 are sealed in place after mounting in the frame of the detector head. As illustrated in the partial side view of FIG. 2 (in which a side cover plate 14 of the detector head has been removed to show the internal components), the transducer unit 18 projects two beams 20 and 21 across the gap. These beams are detected by the lower transducer unit 15. As illustrated in FIG. 2, a web 24 of material extends partially into the gap to partially block the first beam 20 by which the position of the edge of the web 24 can be determined. The second beam 21 is not partially blocked by the web 24 and is used to allow calibration inasmuch as the second beam 21 passes through the same ambient air conditions (relative humidity, dust, etc.) as the first beam 20. The use of the two beams 20 and 21 to sense the position of the web 24, and provide compensation for ambient air conditions, is described in the aforesaid U.S. Pat. Nos. 5,072,414 and 5,274,573, the disclosures of which are incorporated herein by reference. It is understood that the transducer units 15 and 18 may be utilized in the same manner as the separate ultrasonic transmitter and receiver units described in the patents.

Figure 3:
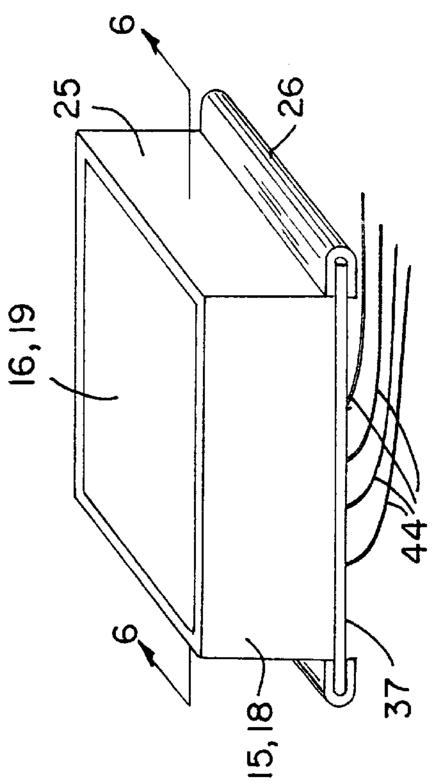
FIG. 3 is an illustrative perspective view of a transducer unit in accordance with the invention which may be utilized in the detector head of FIG. 1.

The transducer units 15 and 18 may be substantially identical, and the following description of the construction and operation of these units applies to both. A transducer 15 or 18 is shown in perspective view in FIG. 3, in which the top or free surface 16 or 19 of the transducer unit faces upwardly. The transducer units 15, 18 may be formed in a substantially rectangular shape, as shown, having a substantially rectangular top surface 16, 19. A protective sleeve 25, for example, formed of neoprene rubber foam or polyethylene foam, extends around the lateral periphery of the transducer units 15 and 18 to provide physical protection and also sound isolation of the units from the surrounding portions of the frame of the detector head 10 to which the transducer units 15 and 18 are mounted. Tabs 26 extend outwardly from the lower or bottom side of the transducer units 15 and 18 to allow mounting of the transducer units in proper position within the detector head frame.

Figure 4:
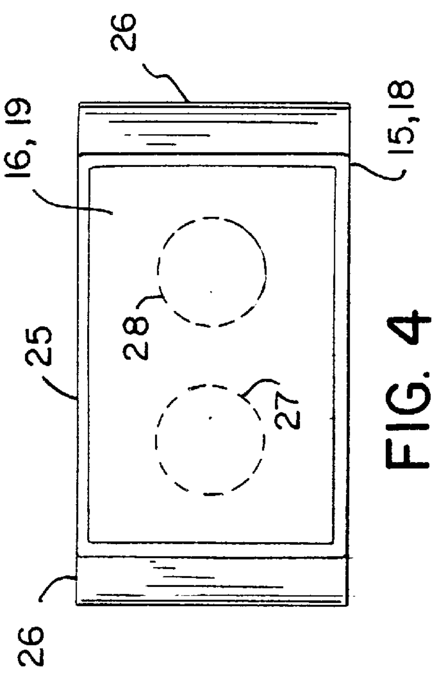
FIG. 4 is a top view of the transducer unit of FIG. 3.
Figure 6:
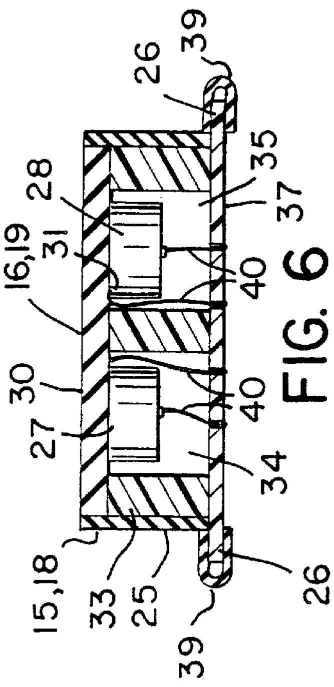
FIG. 6 is a cross-sectional view of the transducer unit of FIG. 3 taken generally along the lines 6—6 of FIG. 3.
Figure 7:
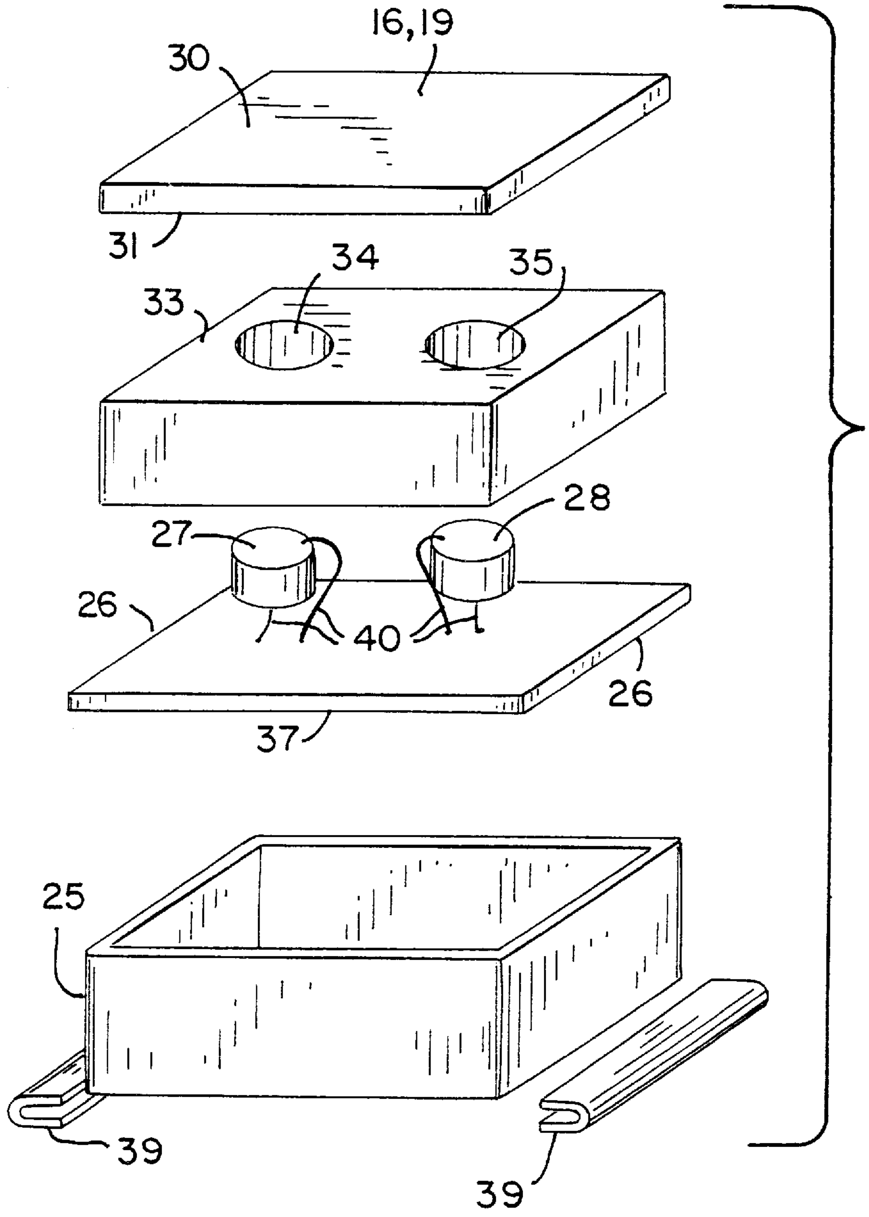
FIG. 7 is an exploded view of the transducer unit of FIG. 3 showing the various components of the transducer unit that are assembled to form the unit.

As illustrated in the top view of FIG. 4 and the cross-sectional view of FIG. 6, within the transducer units 15, 18, ultrasonic transducer elements 27 and 28 are mounted in spaced position relative to one another. As best shown in the cross-sectional view of FIG. 6, the outer surfaces 16, 19 are defined by the outer face (top face) of a sound conducting plate 30 formed of a sound conducting material, as described further below. The transducer elements 27 and 28 are mounted to the bottom or inner surface 31 of the sound conducting plate 30 and are in good sound conducting contact with the plate 30. As also illustrated in FIG. 6, the transducer elements 27 and 28 may be separated from one another by a spacer 33 which has cylindrical openings 34 and 35 therein, as also illustrated in the exploded view of FIG. 7. The spacer 33 may be formed of various structural materials, e.g., an epoxy-fiberglass laminate. A sealing plate 37, which may be formed as a conventional printed circuit board, is mounted to the bottom of the spacer 33 to cover the openings 34 and 35 and thereby seal in the transducer elements 27 and 28. The sound conducting plate 30 and the bottom sealing plate 37 may be glued, such as with epoxy adhesive, to the spacer 33 to form a fully sealed unit. The protective sleeve 25 is then drawn around the completed unit to protect it and provide sound isolation. The tabs 26 are also preferably covered by a piece of sound insulating material 39 similar to the material of the sleeves 25, for example, neoprene foam rubber or polyethylene foam, so that vibrations will not be substantially conducted from or to the material forming the detector head frame within which the transducer units 15 and 18 are mounted.

The ultrasonic transducer elements 27 and 28 may be formed of any conventional ultrasonic transducer construction. A preferred transducer is a piezoelectric disk, which may be of conventional construction, formed of piezoelectric ceramic material. The disk preferably has a circular periphery with flat bottom and top surfaces to which metal is applied to form electrically conductive plates on the top and bottom of the transducer element. The piezoelectric element may be selected in resonant frequency, frequency tolerance, thickness and electrode configuration to suit particular applications for the invention. An example is a piezoceramic material known as PZT-5A (Morgan Matroc, Inc.—Vernitron Division, Navy Type II (or DOD, Type II) lead zirconate titanate (PZT) piezoelectric ceramic), formed in a flat disk shape with silver electrodes, e.g., available from American Piezo Ceramics, Inc., Mackeyville, Pa., American Piezo Ceramic part #D, 10 mm×3 mm, 200 KHz±2%—850 (material APC-850).

Figure 5:
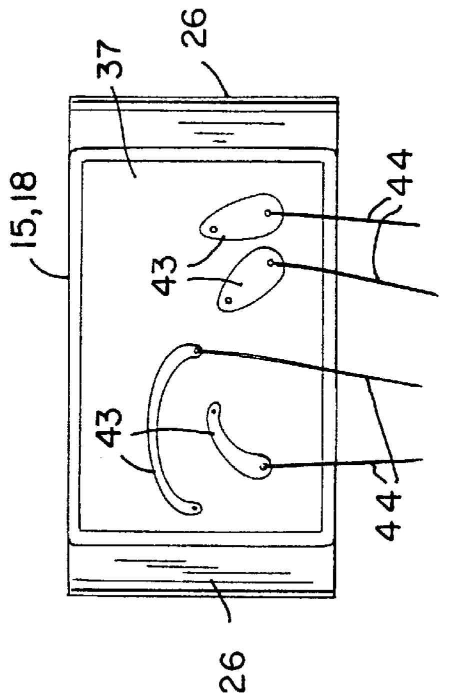
FIG. 5 is a bottom view of the transducer unit of FIG. 3.

As best illustrated in FIGS. 5 and 6, wires 40 are electrically connected to the top and bottom surface plates of the transducer elements 27 and 28 and extend through the circuit board 37 to electrical connection pads 43, shown in the bottom view of the transducer units in FIG. 5. Relief depressions may be formed in the bottom surface 31 of the sound conduction plate 30 to allow space for the soldered connection of the wires 40 to the top conducting plates of the piezoelectric elements 27 and 28. As illustrated in FIG. 2, signal conduction wires 44 are connected to the contact points on the bottom of the circuit board sealing plate 37 and provide connection to a circuit board 45 which may be mounted and sealed within the detector head to provide initial amplification and conditioning of the signals transmitted to and received from the transducer units 15 and 18. Electrical connecting wires 46 extend from the detector head to provide signals to the transmitter transducers and to send out the received signals from the receiver transducers to an external main controller and electronic signal processing circuitry (not shown), which may be as described in U.S. Pat. Nos. 5,072,414 and 5,274,573.

The sound conducting plate 30 serves preferably both to support the transducer elements 27 and 28 and to couple sound from the transducer elements to the ambient atmosphere and vice versa. It has been found, in accordance with the present invention, that the accurate and faithful transmission of sound from or to the transducer elements is not adversely affected by the fact that the sound conducting plate 30 is much larger than the area of the faces of the transducer elements 27 and 28 which are attached to the plate, or by the fact that the plate 30 is rectangular in shape (or of other complex geometry) rather than being circular in shape to match the circular periphery of the transducer elements 27 and 28. The sound conducting plate 30 is preferably formed of a material that has low attenuation and low distortion in transmission of the sound from the inner face 31 to the outer face 16 or 19. A preferred sound transmission material is generally of the type utilized in prior single transducer element piezoelectric transducers, and is composed of hollow glass microspheres embedded in an epoxy matrix. (Hollow glass microspheres are also referred to as glass bubbles, hollow glass spheres, glass Microballoons, hollow glass Microballoons, or hollow microspheres.) In forming such material, hollow glass microspheres, which are obtained in the form of a fine dry powder, are mixed with liquid epoxy to a desired consistency which is then hardened to form a solid. The solid material is precisely formed such that a firm, smooth surfaced plate having very parallel inner and outer faces of well controlled flatness is produced. An exemplary material is an epoxy/glass foam obtained in the form of a block (e.g., 8"×8"×8") produced by Appli-Tec, Inc., Haverhill, Mass., as part #PTA-19-0463-180, formed of #6717 hollow glass microspheres, 0.13 g/cm$^3$ density (PQ Corporation) and #BF-107 epoxy, high temperature, unfilled (Appli-Tec, Inc.). Dispersal agents and other additives may be used to ensure uniform distribution of the microspheres throughout the epoxy. The solidified material is a "foam" created by the addition of hollow glass microspheres to epoxy resin rather than by injection of gas or the addition of foaming agents. This material has been used in various applications, including sonar and hydrophone housings, spacecraft re-entry shields, boat hulls, and bowling ball cores, as well as in ultrasonic transducers. The most important acoustic and mechanical properties of this foam material are low sound speed, low sound absorption, and low density. It is also important that there be low variation in these properties throughout one block and from block to block. The material is machined to precise dimensions (e.g., by American Piezo Ceramics) to form the sound conducting plate. For a 200 KHz transducer, an exemplary thickness of the plate is 0.1080 inch (2.7432 mm) ±0.0005 inch (0.0127 mm). The adhesive used to adhere the transducer elements 27 and 28 to the bottom surface 31 of the plate 30 may be filled with solid glass spheres to ensure a uniform bond thickness when the parts are pressed together. The spheres also provide friction between the parts to minimize movement during the adhesive cure cycle. An example of such material is IPN Industries, Inc. #EGA-142-0029 epoxy, high temperature, filled with 0.0029 inch diameter solid glass spheres.

Suitable materials for the spacer 33 and the printed circuit board 37 are, respectively, G10 epoxy/glass laminate sheet (Atlas Fibre Company) and FR4 epoxy/glass laminate sheet, copper clad (Circuit Masters, Inc.).

Because the inner face 31 and outer faces 16, 19 of the sound conducting plate 30 can be made parallel with high accuracy, and the transducer elements 27 and 28 can be adhered to the bottom face surface 31 of the plate 30 so that they are precisely aligned by their adherence to the plate, alignment of the sound beams transmitted from the transducers 27 and 28 is assured. Because of this construction, the beams will remain aligned throughout the life of the transducer unit despite physical wear and tear, thermal expansion and contraction, and so forth. No further adjustment or maintenance is required during use. Moreover, the uniformity of the material forming the plate 30 and the parallelism of the inner and outer surfaces of the plate assures that the sound projection characteristics of the transducer elements 27 and 28 will be well matched. Similarly, the sound reception characteristics of the transducers 27 and 28 for sound impinging upon the sound conducting plate 30, will also be well matched. Because of the physical proximity of the transducer elements, and their mounting to the same sound conducting plate, each transducer element will also be at the same temperature.

Figure 8:
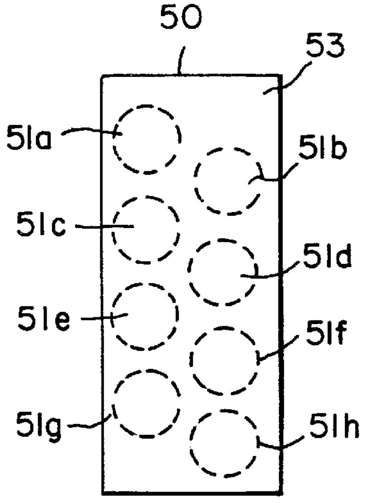
FIG. 8 is a top view of a further embodiment of a transducer unit in accordance with the present invention which incorporates more than two transducer elements.

An example of an extension of the unitary transducer unit of the present invention is illustrated by a top view of a transducer unit 50 in FIG. 8 which has eight transducer elements 51*a–h* (shown in dashed lines) mounted to the bottom of a sound transmission plate 53. The present invention may utilize any desired number of transducer elements, in a variety of geometric relationships, as desired for the particular application in which the transducer units are to be used. As illustrated in FIG. 8, the position of the transducer elements 51, which may be secured to the bottom surface of the plate 53 in the same manner as described above for the transducer units 15 and 18, can be formed such that the elements 51 are adjacent to one another and at least partially overlap in a dimension extending along the length of the transducer unit moving in a lateral direction closer to or further from the web. The construction of the multiple transducer element transducer unit 50 may be carried out as described above for the units 15 and 18.

The transducer units 15 and 18, illustrated in FIGS. 1–7, with two piezoelectric transducer elements 27 and 28 assembled onto a single epoxy-glass foam sound conducting plate 30, are only capable of producing and receiving relatively narrow ultrasonic beams. The transducer unit 50, illustrated in FIG. 8, and having multiple transducer elements 51*a–h* assembled on a single sound conducting plate 50, is capable of producing a much wider ultrasonic beam. The use of a wide beam solves several limitations of narrow beam web edge detection. A wide beam provides greater adjustment range for electronically repositioning a web material within the detector head gap, without requiring mechanical repositioning of the detector head. For example, as long as an ultrasonic beam transmitted or received by one of the transducer elements 51*a–h* of FIG. 8 is partially blocked by a web material in the detector head gap, the detector head need not be mechanically repositioned. With multiple transducer elements 51*a–h* positioned along the length of the transducer unit 50, there will thus be less need to mechanically reposition the detector head as the edge of a web material in the detector head gap moves along the length of the transducer unit 50. In center line guiding of a web material, the position of a moving web is monitored by using values from two detector heads located on opposite sides of the web to calculate a center line value corresponding to the position of the web center line. The center line of the web may, thereby, be accurately positioned, so long as both web edges partially block ultrasonic beams transmitted and received by transducer elements in both detector heads. Detector heads employing a transducer unit 50 having multiple transducer elements 51*a–h* positioned thereon along the length of the transducer unit 50 may be used to accommodate wider variations in web width, when center line guiding, without requiring mechanical repositioning of the detector heads. Finally, a web edge detector employing a transducer unit 50 having multiple transducer elements 51*a–h* positioned thereon may be employed to provide greater stability when guiding acoustically translucent web materials having non-homogenous density.

The transducer elements 51*a–h* of the transducer unit 50 are attached to the sound conducting plate 53 in two parallel rows. Thus, transducer elements 51*a*, 51*c*, 51*e*, and 51*g* are attached to the plate 53 in a first row, with transducer elements 51*b*, 51*d*, 51*f*, and 51*h* attached to the plate 53 in a second row. The rows are offset relative to each other such that a gap along the width of the transducer unit 50 between two transducer elements in one row is completely covered by a transducer element in the other row. In this manner, transducer unit 50 may be used to provide (or receive) overlapping ultrasonic beams along the length of the transducer unit 50, thereby providing a continuous unbroken sensing area from one end of the transducer unit 50 to the other.

The transducer unit 50, with the array of multiple transducer elements 51*a–h*, may be used to provide web edge detection with compensation for changing ambient air conditions in the detector head gap in the manner described previously. This may be accomplished by using the last transducer element 51*h* in the tightly packed array of transducer elements 51*a–h* for compensation, and the other transducer elements 51*a–g* for web edge sensing. Several methods are possible for employing the array of transducer elements 51*a–h* to provide web edge detection and compensation. Assume, for example, that transducer units 50 are mounted in the detector head 10 such that transducer element 51*a* is closest to the open end of the detector head gap, with transducer element 51*h* closest to the base section 11 of the detector head 10. A first, and simplest, method for employing the transducer elements 51*a–h* to provide web edge detection and compensation is to always use the transducer element 51*h* nearest the base section 11 of the detector head 10 to provide or receive a compensation beam, ignore the next element 51*g*, and use the remaining elements 51*a–f* for web edge sensing beams. Since the compensation beam must remain unblocked at all times, the second transducer element 51*g* from the base section 11 of the detector head 10 cannot be used in this method, due to the overlap between adjacent beams.

A second method for employing the multi-transducer element array of transducer unit 50 for web edge detection and compensation has three distinct operating modes. In mode 1, when beams associated with the two transducer elements 51*g* and 51*h* nearest the base 11 of the detector head 10 are not covered by a web, the beam provided or received by the transducer element 51*h* nearest the base 11 of the detector head 10 is used for compensation readings, the beam provided or received by the next transducer element 51*g* is ignored, and beams associated with the remaining transducer elements 51*a–f* are used for web edge sensing operating mode 2 is entered if a web moves along the length of the transducer unit 50 toward the base 11 of the detector head 10, and begins to block the beam provided or received by the transducer element 51*g*. E.g., mode 2 may be entered into when the signal received by the receiving transducer element 51*g* drops to less than 90% of its fully uncovered value (other values may also be used). Upon entering mode 2, the last compensation beam reading provided by the transducer element 51*h* is stored, and then operating mode 3 is immediately entered into. The web edge detection system remains in operating mode 3 as long as the beam provided or received by the transducer element 51*g* is partially or wholly covered by the web. While in mode 3, the compensation algorithm uses the last stored compensation beam value in its computations, instead of up to date compensation beam readings, and ultrasonic beams provided or received by all of the transducer elements 51*a–h* of the transducer unit 50 are used for web edge sensing. If the web reverses direction, and uncovers the ultrasonic beam provided or received by the transducer element 51*g*, e.g., such that the signal level received by the receiving transducer element rises to 90% of its fully uncovered value, or more (other values may also be used), the system may immediately return to operating mode 1. This multiple operating mode method of employing the transducer elements 51*a–h* permits the entire array of transducer elements to be used for web edge sensing, as necessary, and prevents corruption of the compensation algorithm if the web wanders too close to the compensation beam. This method will result in position reading inaccuracies in operating mode 3 if environmental conditions change sufficiently to invalidate the stored compensation beam value. Thus, this method works best if the system is not expected to remain in operating mode 3 for long periods of time.

Figure 9:
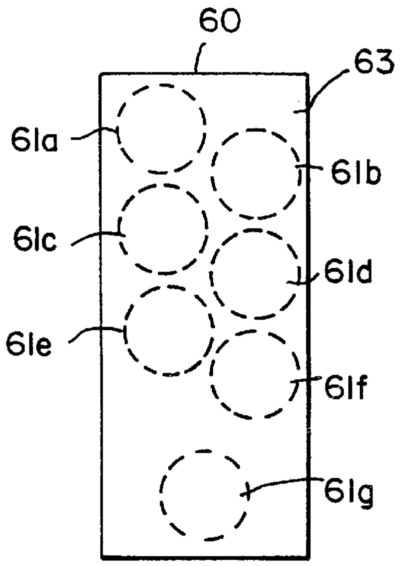
FIG. 9 is a top view of another further embodiment of a transducer unit in accordance with the present invention which incorporates more than two transducer elements.

A further example of a multiple-transducer element transducer unit in accordance with the present invention is illustrated at 60 in FIG. 9. This exemplary transducer unit 60 has seven transducer elements 61*a–g* (shown in dashed lines) mounted to the bottom of a single sound conducting plate 63. Transducer elements 61*a–f* are secured to the plate 63 in the same manner as described above for the transducer units 15 and 18, and are arranged in an array similar to the array of transducer elements 51*a–h* on the transducer unit 50 of FIG. 8. Thus, the transducer elements 61*a–f* are arranged in two rows along the length of the transducer unit 60, with minimum spacing between adjacent transducer elements (e.g., 1 mm), and with the two rows offset relative to each other so that any gaps along the width of the transducer unit 60 between two transducer elements in one row are completely covered by a transducer element in the other row. The overlap along the length of the transducer unit 60 between ultrasonic beams produced by the transducer units 61*a–f* is approximately 25%, providing for a smooth and continuous transition from one beam to the next along the length of the transducer unit 60. In this case, 25% overlap refers to the fact that when the signal level received by one transducer element drops to 25% of the uncovered value (because it is mostly covered by the web), the closest adjacent transducer element, located in another row and nearer the base of the detector head, will receive a signal level of approximately 75% of its uncovered value (because it is partially covered by the web). Transducer units 60 may be mounted in a web edge detector head 10, such that the transducer element 61*a* is nearest the open end of the gap in the detector head 10. An extra transducer element 61*g* is located at the end of the array of transducer elements 61*a–f*, and is thus positioned near the base 11 of the detector head 10. The transducer element 61*g* is used exclusively for transmitting (or detecting) an ultrasonic compensation beam. The compensation transducer element 61*g* is located close enough to the array of transducer elements 61*a–f* so that the same air gap conditions that are encountered by beams associated with transducer elements 61*a–f* in the array, which are used for web edge sensing, are encountered by the compensation beam provided or received by the transducer element 61*g*. However, the compensation transducer element 61*g* is preferably located far enough from the other transducer elements 61*a–f* so that, in normal operation, it will remain completely unblocked at all times, regardless of where the web edge is positioned along the transducer element 60 within the web edge sensing beams provided or received by the array of transducer elements 61*a–f*.

A variation of the multiple operating mode method described above is useful for employing the array of transducer elements 61*a–g* of transducer unit 60, with dedicated compensation transducer element 61*g*, for web detection with compensation for changing gap conditions. In operating mode 1, ultrasonic beams provided or received by transducer elements 61*a–f* are used for web edge sensing, and an ultrasonic beam provided or received by transducer element 61*g* is used for beam signal compensation. If the ultrasonic beam associated with the transducer element 61*f* closest to the compensation transducer element 61*g* becomes almost completely blocked, e.g., the signal received by the receiving transducer element drops to less than 10% of its fully uncovered value (other values may also be used), operating mode 2 is entered into. In operating mode 2, the last compensation beam reading is stored and operating mode 3 is immediately entered into. In operating mode 3, the transducer elements 61*a–f* continue to be used for web edge sensing, however, no new compensation beam values provided by transducer unit 61*g* are used, as the web edge has wandered close to the position of the compensation transducer element 61*g*, which may result in corruption of the compensation beam value. Operating mode 1 is returned to if the web edge reverses direction, to at least partially uncover the edge sensing transducer element 61*f* closest to the compensation transducer element 61*g*. E.g., operating mode 1 may be returned to if the signal level received by transducer element 61*f* rises to 10% of its fully uncovered value, or more (other values may also be used). This operating method thus makes full use of the transducer elements in the array 61*a–f* for web edge sensing, and prevents corruption of the compensation algorithm if the web wanders too close to the compensation beam provided by transducer element 61*g*.

In employing the web edge sensing transducer elements in a multi-element array, e.g., transducer elements 51*a–h* of FIG. 8, or transducer elements 61*a–f* of FIG. 9, to provide and receive ultrasonic sensing beams, several patterns for scanning the transducer elements in the array are possible. The particular scanning method employed may be optimized for the particular type of web material being sensed. For acoustically opaque web materials, the scan pattern may include only an ultrasonic beam provided by a transducer element located nearest the web's edge (and a compensation beam). As the web edge wanders laterally within the edge detector gap, i.e., the web edge wanders along the length of the transducer unit, other beams will be activated by selecting other transducer units as necessary to follow the web's edge, and thereby maintain a linear position reading of the web edge's position. For example, assume that the edge of an acoustically opaque web material passes through the ultrasonic beam provided by transducer element 61*c* in FIG. 9. In the scanning pattern described, ultrasonic beams will only be provided (and received) by transducer elements 61*c*, for web edge sensing, and 61*g*, for compensation. If the web moves closer toward the base 11 of the detector head 10 in which the transducer unit 60 is mounted, the beam produced by transducer element 61*c* will become more blocked. As the beam produced by transducer element 61*c* becomes, e.g., more than 75% blocked, i.e., the signal level received by the corresponding receiving transducer element drops to less than 25% of its fully uncovered value (other values may also be used), the scanning pattern is adjusted, and an ultrasonic beam provided by transducer element 61*d* is activated to provide web edge sensing, replacing the beam provided by transducer element 61*c*. If, on the other hand, the edge of the web material moves closer toward the detector head gap opening, the beam produced by transducer element 61*c* will become less blocked. If the beam provided by transducer element 61*c* becomes less than, e.g., 25% blocked, i.e., the signal level received by the corresponding receiving transducer element rises to more than 75% of its fully uncovered value (other values may also be used), then the scan pattern is adjusted by providing an ultrasonic beam from the next transducer element 61*b* in the array to replace the beam provided by transducer element 61*c*.

For acoustically translucent web materials, the scanning pattern may preferably include ultrasonic beams provided by all of the transducer elements in the array, e.g., transducer elements 61*a–f*, scanned in sequence. All of the readings from a single scan of the transducer elements 61*a–f* are then combined into a single numerical position value by averaging the readings from the scan. A compensation beam provided by the compensation transducer element 61*g* would also be scanned, to provide compensation, but would not be included in the averaging computation. This scanning method helps smooth the variations from one scan to the next which can result from using only one edge sensing beam on translucent materials. Many acoustically translucent materials are not perfectly homogenous. Variations in acoustic transparency from one position on the web edge to the next can result in a false perception of web edge movement. By averaging readings collected from a larger area close to the web edge, these variations can be electronically filtered, thereby reducing the apparent movement of the web edge. Thus, ultrasonic transducer units in accordance with the present invention may be used for web edge detection of web materials that are only approximately 6–7% acoustically opaque.

It should be apparent that many other scanning patterns than those described herein may also be employed. The scanning pattern employed is preferably optimized for the particular type of web material being sensed. Scanning patterns preferably include, but do not require, reading a compensation beam.

A portion of a controller circuit for applying a scanning pattern, such as one of the patterns described previously, to transducer units in a detector head including arrays of transducer elements, is described with reference to the block diagram of FIG. 10. Control signals from an external main controller board (not shown) are provided to the detector head 10, and received web edge detection signals from the detector head 10 are provided to external electronic signal processing circuitry. Power for the detector head, the control signals, and the received signals are all routed between the external main controller and the sensor head 10 through the connecting wires (cable) 46. The external signal processing circuitry is typically located on the external main controller board, along with the control signal generating circuitry that determines the transducer element scan pattern to be used. Preferably, a user programmable microprocessor based system may be used to generate the desired control signals.

Within the detector head 10 itself, a decoder/driver circuit 70 decodes a coded pulse train sent from the main controller board over a twisted pair of wires 71, which form part of the connecting wires 46. This same pair of wires 71 also conveys from the external controller board all of the power required by the decoder/driver circuit 70. The pulse train transmitted to the decoder/driver 70 contains two pieces of information. First, an address pulse train indicates which transmitting transducer element in an array of transducer elements on a transmitting transducer unit in the detector head 10 is to be driven to provide an ultrasonic beam. Second, a duration pulse train indicates how many drive pulses the selected transducer element is to receive. After decoding the address pulse train, the decoder/driver circuit

70 routes the duration pulse train to the selected transducer element. The drive signals are provided from the decoder/driver circuit 70 to the selected transmitting transducer elements along the signal conduction wires 44, as described previously. In this manner, the transmitting transducer elements are selected and pulsed, one at a time in the selected scanning pattern, using information and power transmitted from the external controller board over the single twisted pair of wires 71. The decoder/driver circuit 70 may be implemented in a conventional manner to perform the functions described, using, for example, conventional integrated circuit decoder elements for decoding the control signal pulse train, and buffers for driving the transmitting transducer elements.

Signals from receiving transducer elements in a transducer element array in a receiving transducer unit in the detector head are provided along the signal conduction wires 44, as described previously, to a decoder/multiplexer circuit 72. The decoder circuit 72 receives a coded pulse train from the external main controller board over a second twisted pair of wires 73, which form part of the electrical connecting wires 46. The pulse train provided to the decoder circuit 72 contains an address signal which indicates which receiving transducer element in the transducer element array is to be connected to an amplifier/driver circuit 74. The address provided to the decoder circuit 72 will typically select the signal from the receiving transducer element located directly across the detector gap from the transmitting transducer element activated by the decoder/driver circuit 70 to be connected to the amplifier circuit 74. After decoding the address pulse train, the decoder/multiplexer circuit 72 connects the selected receiving transducer element signal to the amplifier circuit 74 via line 75. The amplifier/driver circuit 74 amplifies the signal from the selected receiving transducer element, and transmits it to the external main controller board through the twisted pair of wires 73. This is the same pair of wires which conveys the address pulse train from the external main controller board to the decoder/multiplexer circuit 72. This pair of wires 73 may also provide all of the power required by the decoder/multiplexer 72 and amplifier/driver 74 circuits. Thus, the receiving transducer elements are selected, and their signals amplified and transmitted to the external controller board, one at a time in the selected scanning pattern, using control signals and power provided from the external main controller board over a single pair of twisted wires 73. The decoder/multiplexer circuit 72 and amplifier/driver circuit 74 may be implemented to perform the functions described using conventional integrated circuit decoders/multiplexers, amplifiers and line drivers.

A third twisted pair of wires 77 may be provided as part of the electrical connecting wires 46 to convey a control signal from the external main controller board to a null indicator lamp 78 located in the detector head 10. The indicator lamp 78 is preferably a tri-color lamp (red, green, off) which indicates the position of the web. The indicator lamp 78 is turned off when the web edge is at the selected guide point. The indicator lamp is turned on, indicating red or green, when the web edge is not at the guide point. Operation of the indicator lamp 78 is provided from the external main controller which, based on the web edge sensing and compensation signals received from the receiving transducer elements via the amplifier/driver circuit 74, determines the position of the web edge in the manner described previously. The indicator lamp 78 may be implemented in a conventional manner, such as using light-emitting diodes.

Figure 10:
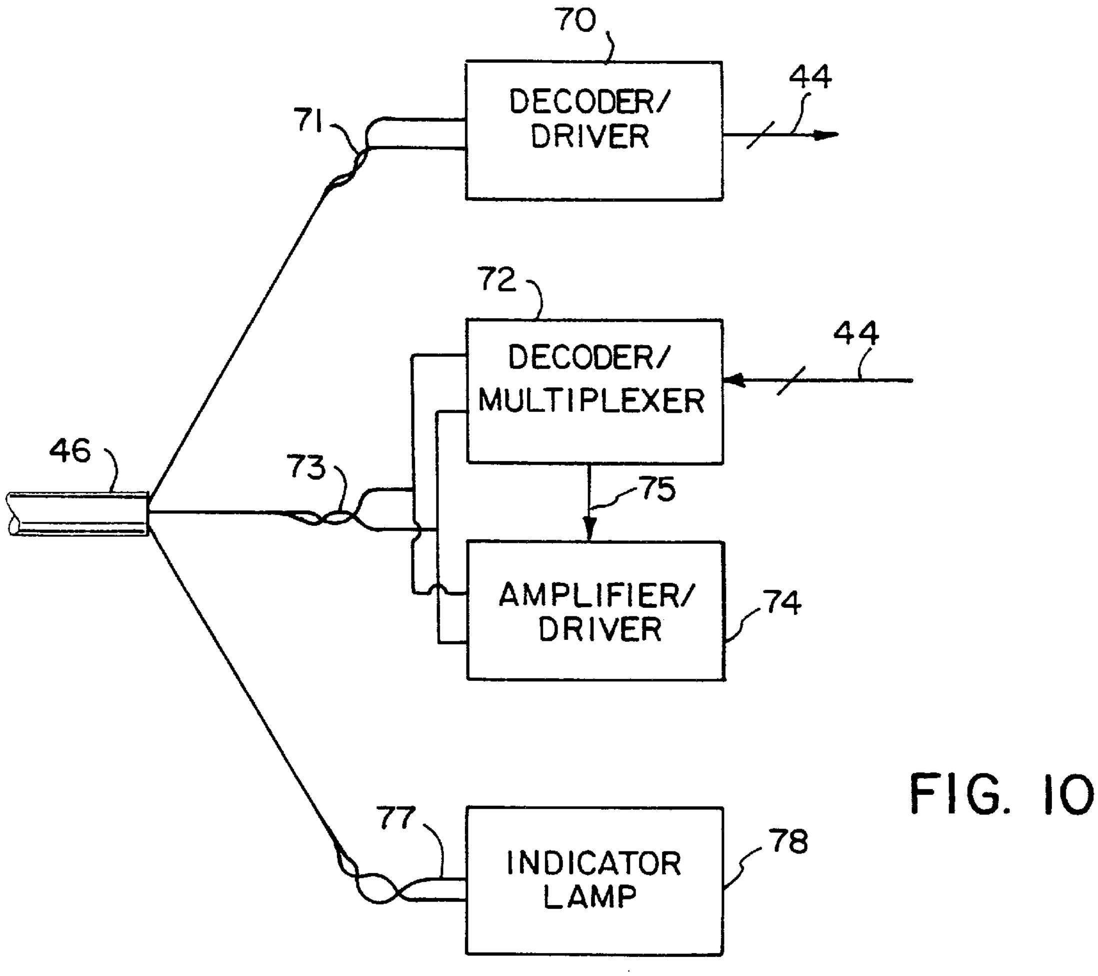
FIG. 10 is a schematic block diagram of a portion of a control circuit for a detector head for ultrasonic web detection employing multiple transducer element transducer units in accordance with the present invention.

An exemplary sequence of operation for the controller circuit illustrated in FIG. 10 is as follows. The external controller board transmits an address pulse train over the connecting wire 46 to the decoder/driver circuit 70 and decoder/multiplexer circuit 72 through the twisted pair wires 71 and 73, respectively. The address signals correspond to transducer elements that are located directly across the web detector gap from each other. Recall that for every transmitting transducer element in a multiple transducer element transducer unit, there is a corresponding receiving transducer element located on the opposite side of the edge detector gap, positioned so that the line normal to the center of the receiving element is parallel and coincident with the line normal to the center of the transmitting transducer element. The external controller then waits a predetermined length of time, e.g., several milliseconds, to allow the amplifier/driver circuit 74, which receives a signal from the addressed receiver transducer element, to stabilize. This stabilization period is required because selecting a new received transducer signal input to the decoder/multiplexer circuit 72 to be applied to the amplifier/driver circuit 74 generates an unusually large transient signal at the amplifier 74 input. The amplifier 74 requires several milliseconds to recover from this disturbance. The external main controller then transmits the duration pulse to the decoder/driver 70. The external controller captures the peak level of the signal returned to it on the lines 73 and 46 from the amplifier/driver 74. The external controller utilizes this peak level in its control algorithm to determine and control the position of the web edge, such as in the manner described in U.S. Pat. Nos. 5,072,414 and 5,274,573. The external controller then determines which transducer elements to scan next, such as by employing one of the scanning procedures described previously, and returns to the first step of transmitting an address pulse train to the decoder/driver circuit 70 and decoder/multiplexer circuit 72.

A benefit of the bi-directional signaling method utilized by the circuit illustrated in FIG. 10 is the reduced wiring requirement between the external main controller board and the detector head. As described, this system requires only six conductors in the connecting wire 46. The use of three separate circuits, transmitter, receiver, and indicator, electrically-isolated from each other, each independently powered and controlled by its own twisted pair of wires 71, 73, and 77, respectively, is more immune to electrical noise than other methods having separate control wires and non-isolated circuits. Moreover, since the transmitted or received signals from all of the transducer elements are routed through the same driver/amplifier circuits, there is inherent compensation for drift or mismatch in the amplifier and cable line driver circuits.

The decoder/driver circuit 70, decoder/multiplexer circuit 72, amplifier/driver circuit 74, and indicator lamp circuit 78 may be provided on the circuit board 45 mounted within the detector head 10, with, as described above, signal conduction wires 44 connecting the transmitting and receiving transducer elements to the decoder/driver circuit 70 and decoder/multiplexer circuit 72, respectively. Alternatively, the decoder/driver circuit 70 may be formed on a portion of the circuit board sealing plate of the transmitting transducer unit. Similarly, the decoder/multiplexer circuit 72 and amplifier/driver circuit 74 may be formed on a portion of the circuit board sealing plate attached to the receiving transducer unit. The null indicator lamp circuit 78 may preferably be formed on the transmitter circuit board, and is preferably electrically isolated from the other circuits on the transmitter board. The circuitry on the transmitter and receiver circuit boards may occupy a small area at one end of the board, while the transducer sub-assembly, consisting of a sound conducting plate, transducer elements, and a spacer, as described previously, occupies the majority of the remaining area of the circuit board. This method of construction eliminates the need for wiring between the transducer elements and a separate circuit board. The connections between the transducer elements and the decoder/driver 70 and decoder/multiplexer 72 circuits may be formed by conductors directly deposited on the transmitter and receiver circuit board sealing plates. Another benefit of the monolithic circuit board/transducer unit design, is that a small compact circuit and reduced wiring reduces the amount of electrical noise picked up from nearby electrical equipment. This is a major concern where a web edge detection unit in accordance with the present invention is used in industrial environments.

An ideal web edge detector in accordance with the present invention should not sense vertical motion or flutter of the web, only lateral motion. Early ultrasonic sensors were very susceptible to this "pass-line" problem. A small vertical movement of the web could be misinterpreted as a large lateral movement, resulting in poor guiding accuracy. As described in U.S. Pat. Nos. 5,072,414, and 5,274,573, this problem may be solved by pulsing the transmitting transducer elements, rather than transmitting a continuous signal. Short ultrasonic pulses from a transmitting transducer element travel across the edge detector air gap to a corresponding receiving transducer element. The peak value of the received signal is captured by a peak detecting circuit and digitized. Since the web blocks a portion of the energy transmitted across the air gap, the peak received signal value is approximately proportional to the position of the web. Meanwhile, the ultrasonic pulse continues to ricochet back and forth across the air gap between the transmitting transducer unit, the receiving transducer unit, and the web. Preferably, the web edge detection system waits a predetermined length of time to allow the echo pulses to fully dissipate before transmitting another pulse. Typically, the peak value detected is the peak value of the pulse on its initial flight across the air gap. As the pulse propagates through the air and ricochets off the transducer units, and other detector head structures, energy is lost, so that the pulse has less energy on subsequent arrivals at the receiving transducer element. The energy level of the subsequent "echo" pulse arrivals is, however, unpredictable. Depending on the precise orientation of the web plane, more or less pulse energy may be deflected out of the web gap on every transit of the pulse. Moreover, over time, debris may accumulate on the transducer units making them less reflective, again affecting echo pulse amplitude. The sound amplitude detected if a non-pulsed ultrasonic signal is used is the combination of initial and echo energy, which can vary for the reasons given above, and, because both are present at the receiving transducer element at the same time, can mutually reinforce or diminish each other depending on their phase relationship at the receiving transducer element (which is also unpredictable).

A pulsed web edge detecting system, therefore, is clearly superior to a continuous transmission system. However, there are regions of operation in a pulsed system where the echo pulse amplitude may be greater than the initial pulse amplitude. The challenge is to identify these regions and avoid them. This problem typically occurs when the web is blocking most of the ultrasonic beam, and the received pulse amplitude is low. Certain web plane orientations will deflect the blocked portion of the pulse, which constitutes most of the total pulse energy in this situation, plus energy which has diverged from the central beam area, a result of the non-zero transducer dispersion angle, back towards the transmitting side of the edge detector, where it is then reflected back toward the receiver. This problem is observed when the transducer element is more than 80% blocked, i.e., the signal level received by the receiving transducer element is less than 20% of its uncovered value. A solution to this problem is to avoid the use of transducer element guide points wherein the position of the web results in more than 75% blockage of the transmitted ultrasonic beam, i.e., the signal received by the receiving transducer element is less than 25% of its fully uncovered value. As described previously, the transducer elements in the transducer units 50 and 60 of FIGS. 8 and 9 are arranged to provide sufficient overlap between adjacent ultrasonic beams so that when one beam approaches 75% blockage, the system can immediately switch to an adjacent transducer element to provide an ultrasonic beam which is only approximately 25% blocked. Thus, the pass-line problem is avoided using an array of transducer elements positioned to provide overlapping ultrasonic beam positions along the length of the transducer unit.

Another problem which an ultrasonic transducer unit designed for web edge detection must solve is the scan-rate problem. The scan-rate problem refers to the rate at which a web edge detection system can interrogate the ultrasonic transducer units. For best dynamic response of the web guide mechanism, it is advantageous to scan the web edge detector at the highest possible rate. This reduces the time lag between sensing the web's position and initiating a correction. The interrogation rate, or scan rate, is a function of the time-of-flight of the ultrasonic pulse beam across the edge detector air gap, the time required for the echo pulse amplitude to decay below the noise floor of the peak detector and digitizer circuit, and the time required for other system tasks. Time-of-flight delay is unavoidable. The time required to complete other system tasks, using high speed integrated circuit devices, etc., is typically less than the echo decay time. Furthermore, these tasks can be executed while waiting for the pulse to decay. Therefore, reducing the echo decay time is the most effective way to increase the scan rate. The decay time can be reduced by rotating either one or both transmitting or receiving transducer units on their long axes, by, approximately, e.g., 5°, so that their faces are not quite parallel to each other. This will deflect some of the pulse energy out of the edge detector gap on each transit of the echo, and thus speed up the decay time. A practical way to achieve non-parallel transducer units is to modify the design of the spacer 33 so that it holds the sound conducting plate 16, 19 at the required angle. Rotating the transducer units does result in a slight reduction in initial pulse amplitude, e.g., approximately 5%, depending on the angle of rotation. However, this is not a significant reduction. The rotation technique is especially valuable when transducer units including an array of transducer elements are used, and where each web edge position reading may require the use of many individual beams from many of the transducer elements in the array. Such may be the case when sensing some acoustically translucent web materials, as described previously. This technique may also be applied to non-array transducer units in accordance with the present invention, in applications requiring higher system bandwidth.

As has been described, the present invention features a transducer unit for web edge detection including multiple transducer elements attached to a single sound conducting plate. The sound conducting plate, which is preferably made of an epoxy-glass foam, provides mechanical support for the transducer elements and serves as an acoustic matching layer between the transducer elements and the surrounding air. The sound conducting plate increases the amount of acoustic energy transferred between the transducer elements and the surrounding air when the transducer elements are used for transmitting, and increases the amount of acoustic energy transferred between the surrounding air and the transducer elements when the transducer elements are used for receiving. The sound conducting plate also decreases the ultrasonic beam dispersion angle in both transmitting and receiving transducers.

In an ultrasonic transducer unit in accordance with the present invention, the main sound conduction path is in a direction normal to the flat surfaces of the sound conducting plate and transducer elements. The thickness of the sound conducting plate is preferably chosen to be equal to one-quarter of the wavelength of the ultrasonic signal being transmitted or received through the sound conducting plate. This thickness increases the sensitivity of the receiving and transmitting transducer elements to sound wave fronts entering or leaving the sound conducting plate parallel to the outside surface thereof. A sound wavetrain entering a receiving transducer element from the surrounding air first crosses the boundaries between the air and the sound conducting plate, and between the sound conducting plate and the transducer element itself. At each boundary, part of the wave energy is reflected and part is transmitted. The wavetrain entering the sound conducting plate will reflect multiple times between the two boundaries, transmitting part of its energy through the boundary on each reflection. Since the thickness of the sound conducting plate is preferably exactly one-quarter of the wavelength of, e.g., 200 kHz sound in the sound conducting plate, the round-trip sound conduction path for a wavetrain reflected between the two boundaries is ½ wavelength. At the boundary between the sound conducting plate and the transducer element, the wavetrain is inverted because the transducer element is denser than the sound conducting plate. At the boundary between the sound conducting plate and the air, the wavetrain is not inverted because air has a lower density than the sound conducting plate. A wavetrain entering the transducer unit is split into two wavetrains upon reaching the boundary between the sound conducting plate and the transducer element. One wavetrain is transmitted through the boundary into the transducer element. The other wavetrain is reflected by the two sound conducting plate boundaries, and reapproaches the boundary between the sound conducting plate and transducer element inverted and delayed by one-half wavelength. This second inverted and delayed wavetrain has, in fact, the same phase as the first wavetrain at the transducer element boundary, and therefore the energy it transmits through the boundary between the sound conducting plate and the transducer element adds to the energy transmitted by the first wavetrain. Like the first wavetrain, the second wavetrain splits again into two new wavetrains, one transmitted and the other reflected. This process continues until the energy in the original wavetrain is totally dissipated through losses in the sound conducting plate and transducer element materials and leakage to the surrounding air. (It should also be noted that some energy is lost to the surrounding air when the received wavetrain first encounters the boundary between the air and the sound conducting plate (through reflection), and after entering the transducer unit, on every subsequent encounter with the boundary between the sound conducting plate and the air (through transmission).

A transmitting transducer unit in accordance with the present invention works similarly to the receiving unit described, with the source, destination, and direction of wavetrain propagation the reverse of those just described. The source of the wavetrain is the transducer element, the destination of the wavetrain is the surrounding air, and the direction of wavetrain propagation is from the transducer element to the surrounding air. As with the receiving transducer, there are multiple reflections and transmissions of the wavetrain at the boundaries between transducer element, sound conducting plate, and air. Multiple wavetrains are transmitted to the surrounding air, all in phase, but each of lower amplitude and greater delay when compared to its predecessor. The sum of the overlapping transmitted wavetrains has a greater peak amplitude when compared with a wavetrain transmitted directly to the surrounding air by a transducer element with no interposed quarter-wave thick sound conducting plate.

Thus, a transducer element in a transducer unit in accordance with the present invention receives multiple wavetrains, all in phase but each of lower amplitude and greater delay when compared to its predecessor. The sum of the overlapping received wavetrains has a greater peak amplitude (several times greater), a longer duration (more cycles), and a rounded amplitude envelope, when compared with a wavetrain received directly by a transducer element with no interposed quarter-wave thick sound conducting plate. A sound wavetrain entering the transducer unit at an angle will travel a longer path through the sound conducting plate, will thereby be delayed longer than the optimal one-half wavelength, causing the reflected wavetrains to arrive out-of-phase with the first wavetrain. The amplitude of the sum of these out-of-phase wavetrains falls rapidly with increasing incoming wavetrain angle. Thus, a transducer unit in accordance with the present invention is highly directional. The density, sound velocity, and sound conduction properties of the sound conducting plate material may be optimized to yield the highest transmitted and received amplitudes. Formulae for calculating ideal substrate properties may be found in acoustics text books. Preferably, however, the material used to form the sound conducting plate may have less than ideal sound conducting properties in order to satisfy other requirements such as rigidity, ruggedness, temperature stability, and chemical resistance.

Although sound transmission between transducer elements on the same sound conducting substrate is possible, in practice it is not a problem if the transmitting transducer elements are alternately pulsed, and the corresponding received signal levels are alternately measured, such as in the transducer element scanning schemes described earlier. When one transmitting transducer element is pulsed, the sound transmitting area is largely confined to a small circular area on the outer surface of the sound conducting plate. This area is approximately the same diameter as, and coaxial with, the transmitting transducer element mounted on the inner surface of the sound conducting plate. The receiving transducer elements behave similarly. Thus, alternate pulsing of the transmitting transducer elements, and alternate measurement of the received signal levels, minimize cross-talk between the elements, and makes possible the effective use of a transducer unit including multiple closely spaced transducer elements. Wider spacing between transducer elements is required to minimize cross-talk between the transducer elements if simultaneous, rather than alternate, pulsing of multiple transducer elements in the transducer unit is employed.

Another advantage of a transducer unit having multiple transducer elements mounted on a single epoxy-glass foam plate substrate is the possibility of achieving a high degree of matching within the transducer unit. Typical web edge detection compensation algorithms assume that web sensing transducers in a transducer unit have identical operational characteristics to the compensation transducer elements in the same unit. These algorithms also assume that the electronic circuits which send, receive, and process signals to and from the web edge sensing and compensation transducer units are also identical. It also assumes that the web edge detecting and compensation ultrasonic beams are located near each other, so that they are operating under nearly identical ambient conditions. If the transducer elements in the transducer unit meet these criteria, then, as ambient or other conditions change, the signal levels received from all transducer element transmitter/receiver pairs will change by the same proportion. Examples of changing conditions include those that affect the propagation of sound across the air gap (air temperature, humidity, suspended dust, air currents, etc.), those that directly affect the operation of the transducer elements (transducer temperature, dirt build-up on the transducer unit, aging of transducer materials, etc.), and those that affect the operation of the electronic signal processing circuits. Note that it is not necessary to match the transmitting transducer element to its corresponding receiver transducer element. Any difference that affects the received signal level will affect the signal level of all beams equally, and will therefore be normalized by the compensation algorithm. However, it is necessary that all transducer elements in a particular transducer unit be property matched.

As described previously, a transducer unit in accordance with the present invention has two key components, a sound conducting plate, and the transducer elements themselves, which together convert electrical energy to acoustic energy and vice versa. Any variation in either component will alter the electrical and/or acoustic behavior of the assembled transducer unit. The piezoelectric transducer elements are typically manufactured in large batches of several thousand units. The batch process begins with formulating, casting, and firing a single batch of ceramic material, from which individual disks are then cut, electroded, and poled. The process is completed with an electrical test to sort the disks into several bins on the basis of one or more parameters, such as resonant frequency. This batch process ensures that all disks are alike when new and taken from the same bin, and will remain alike as they age. (After poling, a piezoceramic will begin to age, with its electro-mechanical characteristics changing at a logarithmic rate.)

Epoxy-glass foam substrates are also produced in large batches. The epoxy and hollow glass microspheres are blended, then cast, and cured in blocks from which individual substrates are cut. Though there is typically some variation in mechanical properties between regions of a block more than several inches apart, the variation is very small from one end of a one-inch long plate of the sound conducting material to the other. In prior art transducer unit designs, only one transducer element is used per piece of substrate material to form a transducer assembly. Thus, in order to achieve matched compensation and edge sensing transducer units in each arm of a web edge detector head, careful batch coding and tracking of the transducer element and sound conducting plate component parts was necessary. This would require either an additional testing procedure for sorting the epoxy-glass foam substrates, or else a method of tracking substrates so that a matched set of transducer elements could be assembled from substrates cut from one small region of an epoxy-glass block. Currently, no test method or apparatus has been devised for testing or sorting the epoxy-glass foam substrates. Alternatively, assembled transducer units, including single transducer elements attached to their own individual sound conducting plates, could be individually electrically tested at a range of temperatures spanning the specified operating range of the web edge detector in which they will be employed. Then, on the basis of the test results, the individual transducer units that are most alike could be grouped into pairs (or larger groups if array sensors are to be constructed). The transducer unit of the present invention, employing multiple transducer elements on a single sound conducting plate, avoids these difficulties. A transducer unit assembled on a single epoxy-glass plate using piezo transducer elements taken from the same batch and bin yields a closely matched transducer unit that will remain closely matched as it ages.

As described previously, transmitter and receiver transducer units formed in accordance with the present invention may be mounted into slots in a web edge detector head 10, and are retained therein by attaching the side cover plate 14 (see FIGS. 1 and 2). Small foam rubber pads (not shown) may be positioned between the transducer units and the detector head 10 to isolate the transducers from the detector head, thereby preventing cross-talk between transmitting and receiving transducer units through the detector head, and to absorb any dimensional differences between the transducer units and the detector head 10. By restraining all axes of movement, this mounting procedure ensures good alignment of the transducer units with respect to the detector head 10 and each other. The mounting of multiple transducer elements on a single sound conducting plate ensures perfect alignment of the transducer elements with respect to each other. The present invention thus solves the transducer alignment problems common in previous designs, while also simplifying the assembly process.

Although described in detail with respect to a web edge detection system wherein an ultrasonic beam is projected across a detector gap where it is received directly by a corresponding receiving transducer element, it is apparent that transducer units in accordance with the present invention may also be used in reflective-type ultrasonic web edge detection systems. A reflective-type ultrasonic web edge sensor requires the web plane to be non-parallel to the flat surfaces within the sensor gap area, particularly, the outer surface of the transducer unit sound conducting plate. When the web plane is parallel to the transducer unit face, part of the transmitted sound pulse may echo several times between the transducer unit and the web. Because it travels a longer path, a pulse reflected by a reflector positioned on the detector head across from the transmitting transducer element will arrive at the transducer element after the first reflection from the web, may have a lower amplitude than web reflections arriving immediately before and after it, and may, in fact, arrive at exactly the same time as one of the web reflections. Therefore, it is not possible to measure reliably the amplitude of pulses reflected by the transducer element's corresponding reflector. The web plane and transducer unit can be made non-parallel by tilting the entire detector head so that pulses hitting the web will be reflected away from the transducer unit, and not interfere or mask pulses reflected by the transducer element's reflector. The amount of tilt required may be as much as 45°, requiring a wider detector head gap to accommodate vertical motion of the web. In some web processing applications there may not be sufficient space to mount a larger and/or tiled detector head. Another difficulty with reflective-type web edge detection systems occurs when one transducer element is used for both transmitting and receiving. After transmitting a pulse, the transducer element continues to ring. In order to use this same transducer element for receiving the reflected pulse, the ringing amplitude must subside below an acceptable noise threshold by the time that the pulse reflected from the transducer element's reflector arrives at the transducer element. One solution to this problem is to optimize the design of the transducer element for minimum ringing. Another solution is to use two transducer elements, side by side on the sound conducting plate of the transducer unit, one for transmitting and the other for receiving.

It is apparent that the transducer units of the present invention may also be utilized in applications other than web edge detection where plural ultrasonic transmitters or receivers are required. It should thus be understood that the present invention is not limited to the particular embodiments set forth herein as illustrative, but embraces all such modified forms thereof as come within the scope of the following claims.

What is claimed is:

1. A detector head for ultrasonic web edge detection, comprising:

(a) a detector head frame having two arms extending from a base and separated by a gap into which a web of material can pass;

(b) a sound conducting plate made of a sound conducting material and having an outer surface and an inner surface mounted in each of the arms such that the outer surfaces of the sound conducting plates face each other across the gap;

(c) a plurality of ultrasonic transducer elements mounted to the inner surface of each sound conducting plate and arranged on the sound conducting plates such that an ultrasonic signal produced by an ultrasonic transducer element in one of the arms of the detector head is receivable by a corresponding ultrasonic transducer element in the other arm of the detector head.

2. The detector head of claim 1 wherein the sound conducting plate includes hollow glass microspheres in an epoxy matrix.

3. The detector head of claim 1 wherein the ultrasonic transducer elements are piezoelectric disks formed of a piezoelectric ceramic and having flat top and bottom surfaces to which conducting metal is applied, and wherein the top surface of each disk is mounted to the inner surface of the sound conducting plate.

4. The detector head of claim 1 wherein the transducer elements are adhered to the inner surfaces of the sound conducting plates with an epoxy adhesive.

5. The detector head of claim 4 wherein the epoxy adhesive includes glass microspheres incorporated therein.

6. The detector head of claim 1 comprising additionally a spacer mounted to the sound conducting plate and surrounding the transducer elements, and a sealing plate mounted onto the spacer such that the ultrasonic transducer elements are sealed between the spacer, the sealing plate and the sound conducting plate.

7. The detector head of claim 6 comprising additionally a protective sleeve made of a sound isolating material extending around a lateral periphery of the sound conducting plate, the spacer, and the sealing plate.

8. The detector head of claim 1 wherein the plurality of transducer elements are mounted in at least two parallel rows of transducer elements along the length of the sound conducting plate.

9. The detector head of claim 8 wherein the transducer elements of one of the parallel rows of transducer elements are displaced in position along the length of the sound conducting plate from the transducer elements of another of the parallel rows of transducer elements such that a plurality of the transducer elements overlap in positions along a width of the sound conducting plate.

10. The detector head of claim 8 including additionally at least one compensation transducer element mounted to the inner surface of the sound conducting plate such that the parallel rows of transducer elements are positioned between the compensation transducer element and an end of the arm defining an opening of the gap.

11. The detector head of claim 1 wherein the transducer units are mounted in the arms of the detector head such that the outer surfaces of the sound conducting plates are not quite parallel to each other.

12. A method for detecting the position of an edge of a web of material which is being passed through a gap defined by arms of a web edge detector head, comprising the steps of:

(a) mounting an array of ultrasonic transducer elements to an inner surface of a first sound conducting plate to form a transmitting transducer unit and to an inner surface of a second sound conducting plate to form a receiving transducer unit;

(b) mounting the transmitting and receiving transducer units in the arms of the detector head such that outer surfaces of the sound conducting plates face each other across the gap, and such that the ultrasonic transducer elements mounted to the inner surface of each sound conducting plate are aligned such that an ultrasonic signal produced by an ultrasonic transducer element in the transmitting transducer unit is receivable by a corresponding ultrasonic transducer element in the receiving transducer unit;

(c) activating transducer elements in the transmitting transducer unit to provide ultrasonic beam pulses across the gap therefrom;

(d) activating corresponding ultrasonic transducer elements in the receiving transducer unit to receive the ultrasonic beam pulses provided across the gap; and (e) determining the position of the edge of the web material based on the received ultrasonic beam pulses.

13. The method of claim 12 wherein the steps of activating transducer elements in the transmitting and receiving transducer units includes the steps of activating compensation transmitting and receiving transducer elements to provide and receive an ultrasonic beam which is not blocked by the web to any degree, and otherwise only activating transmitting and receiving transducer elements that are positioned to provide and receive ultrasonic beams which are partially but not completely blocked by the web edge.

14. The method of claim 12 wherein the steps of activating transducer elements in the transmitting and receiving transducer units includes the steps of activating each transducer element in a sequence, and wherein the step of determining the position of the web edge includes the step of determining the position of the edge of the web material based on an average of received ultrasonic beam pulses from more than one ultrasonic transducer unit.

15. The method of claim 12 wherein the step of activating a transducer element in the transmitting transducer unit includes the steps of providing to a decoder a first address signal indicating one of the transducer elements in the transmitting transducer unit, decoding the first address signal, and driving the transducer element indicated by the first address signal to provide the ultrasonic beam pulses; and wherein the step of activating a corresponding ultrasonic transducer element in the receiving transducer unit includes the steps of providing to a multiplexer a second address signal indicating one of the transducer elements in the receiving transducer unit, providing to the multiplexer signals from each of the transducer elements in the receiving transducer unit corresponding to the ultrasonic signals received by the ultrasonic transducer elements, selecting based on the second address signal one of the receiving transducer element signals, and amplifying the selected receiving transducer element signal.

16. The method of claim 15 comprising additionally the steps of providing a pulse duration signal defining a pulse duration, and driving the transducer element indicated by the first address signal for a duration defined by the pulse duration signal.

* * * * *